United States Patent [19]

Beery et al.

[11] Patent Number: 4,841,613
[45] Date of Patent: Jun. 27, 1989

[54] PRESSURE DEVELOPER OR PRESS HAVING A PRESSURE ROLL CONTAINING COMPOSITE MATERIAL

[75] Inventors: Jack Beery, Centerville, Ohio; David S. Brookstein, Dedham, Mass.

[73] Assignee: The Mead Corporation, Dayton, Ohio

[21] Appl. No.: 165,214

[22] Filed: Mar. 8, 1988

Related U.S. Application Data

[63] Continuation-in-part of Ser. No. 62,266, Jun. 15, 1987, abandoned.

[51] Int. Cl.$^4$ ............................................. B21B 27/00
[52] U.S. Cl. ....................................... 29/130; 29/132; 100/160; 100/176; 118/114
[58] Field of Search .......................... 29/130, 131, 132; 430/138; 118/114; 100/93 RD, 160, 169, 176; 156/555

[56] References Cited

U.S. PATENT DOCUMENTS

| | | | |
|---|---|---|---|
| 1,785,673 | 12/1930 | Cattran | 29/122 |
| 3,730,794 | 5/1973 | Ross . | |
| 3,776,760 | 12/1973 | Baker et al. . | |
| 3,807,013 | 4/1974 | Sukenik . | |
| 3,842,239 | 3/1976 | Nalband . | |
| 4,015,320 | 4/1977 | Meckel et al. . | |
| 4,042,804 | 8/1977 | Moser | 29/122 |
| 4,050,886 | 9/1977 | Moser . | |
| 4,062,098 | 12/1977 | Brugman . | |
| 4,253,392 | 3/1981 | Brandon et al. | 29/122 |
| 4,372,247 | 2/1983 | Calabrese . | |
| 4,399,209 | 8/1983 | Sanders et al. . | |
| 4,426,411 | 1/1984 | Sasaki et al. . | |
| 4,440,846 | 4/1984 | Sanders et al. . | |
| 4,521,184 | 6/1985 | Samuels et al. . | |
| 4,583,272 | 4/1986 | Keller . | |
| 4,594,068 | 6/1986 | Bardutsky et al. . | |

Primary Examiner—Timothy V. Eley
Assistant Examiner—Irene Cuda
Attorney, Agent, or Firm—Biebel, French & Nauman

[57] ABSTRACT

Roll-type presses or pressure developers include a pressure roll in which one of the load bearing and transmitting materials is a carbon fiber and epoxy composite. The pressure roll has an outer metal tubular sleeve which is filled or substantially filled with a composite material. In one form, an axially central loading shaft is employed and is bonded to the composite material. The material may be tapered from a central loading region on the shaft and outwardly toward the open ends of the sleeve. In another embodiment, the composite material itself forms the support shaft for the roll.

6 Claims, 1 Drawing Sheet

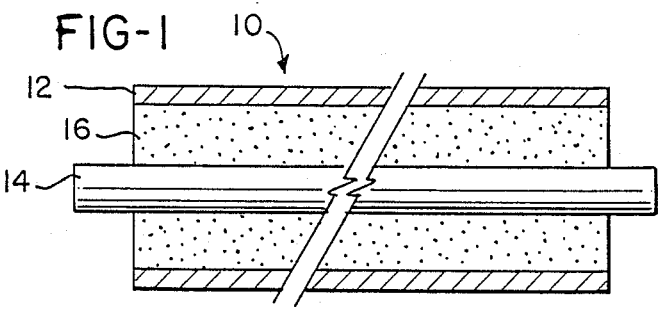
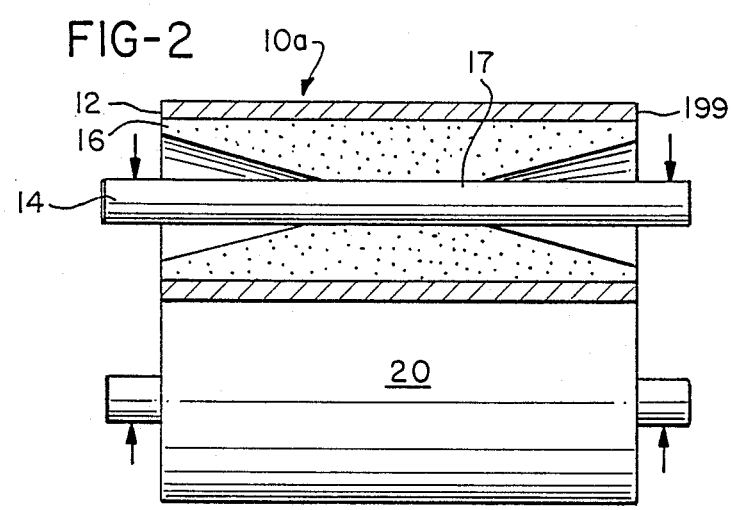
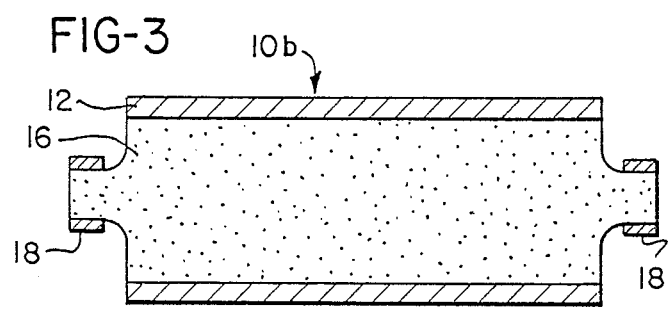

PRESSURE DEVELOPER OR PRESS HAVING A PRESSURE ROLL CONTAINING COMPOSITE MATERIAL

RELATED APPLICATION

This application is a continuation-in-part of copending application Ser. No. 062,266 filed June 15, 1987, now abandoned.

BACKGROUND OF THE INVENTION

The present invention relates to roll-type pressure developers or presses in which one of the pressure rolls contains a load-bearing composite material.

In multiple roll pressure developers or presses, a pair of pressure rolls are commonly used for the application of a uniform pressure to a sheet or web, such as a sheet of paper. The pair of pressure rolls may be shaft-loaded, or may be loaded by an external force applied by one or more additional loading rollers. Roll-type developers are commonly used in the application of a uniform pressure to paper stock across a nip. For example, pressure rolls are commonly used in the application of a uniform pressure to fix images on paper or to rupture the microcapsules of an imaging material, such as that shown in commonly assigned U.S. Pat. Nos. 4,399,209 and 4,440,846. In order to achieve these results, relatively high pressures must be exerted through the pressure rolls on the paper stock. For example, pressures of about 6000 to 8000 lbs/in$^2$ are required for rupturing microcapsules. In designing pressure rolls useful in the application of such tremendous pressure, materials are selected which are capable of performing under such conditions.

In the past, pressure rolls have been made of metallic materials such as steel in order to provide sufficient strength. For example, see U.S. Pat. Nos. 4,426,411 and 4,521,184.

Pressure rolls have also been made of metallic materials with release coatings thereon. For example, U.S. Pat. No. 3,776,760 teaches a fuser roll comprising a roll having a tetrafluoroethylene coating thereon. U.S. Pat. No. 3,942,230 teaches a roll comprising a body member of a base metal, a porous plate of a nickel chromium alloy, and a release film of a fluorocarbon polymer.

Although metallic pressure rolls and coated metallic pressure rolls have been used satisfactorily, such rolls are undesirable because the metallic materials, especially steel, are heavy and expensive.

U.S. Pat. No. 4,372,247 teaches a fusing apparatus which includes a pair of rolls. Each pressure roll comprises a cylindrical metal tube which defines the roll exterior. A cured elastomer such as a urethane elastomer is bonded to the tube interior. The elastomer is also bonded to a support shaft extending through the tube. The fusing apparatus was designed to overcome the disadvantages such as paper wrinkling of a skewed roll apparatus while providing uniform pressure across the nip. However, such a roll may not be sufficiently rigid due to the elastomeric internal material.

A further inherent disadvantage of the system shown in U.S. Pat. No. 4,372,247 is the fact that it will not operate satisfactorily at the high pressures required to develop images in which microcapsules are ruptured, as stated above. The reason for this that a pair of identical pressure, as disclosed, will tend to have identical bending moments at the same axial locations. The deflection curves of a pair of nip-defining rolls can be matched only when the bending moments of the rolls compliment each other, not duplicate each other.

Although improvements in pressure rolls have occurred, a need exists for a pressure roll which is light weight, inexpensive, and has a low scrap rate at production.

SUMMARY OF THE INVENTION

The present invention provides a roll-type press or developer in which one of the nip-forming press rolls contains a composite load-bearing material, and includes a metal tubular or sleeve member with open ends. A fiber composite material is disposed within the tubular member and either forms a support shaft, or is joined with a central support shaft, such that the bending moments on the sleeve are transmitted to the composite material. More specifically, the present invention provides a pressure roll useful in the application of a uniform pressure to paper stock across a nip, when used as one of the pressing rolls of a multiple roll press, such as shown in copending application Ser. No. 039,393 filed Apr. 16, 1987, the disclosure of which is incorporated herein by reference.

In one embodiment, a multiple roll press has a pressure roll including a tubular member, a support shaft disposed in the cylindrical space of the tubular member such that the tubular member and the support shaft are substantially longitudinally coaxial, and a composite material disposed in the annular space between the tubular member and the support shaft.

The foregoing pressure roll is lighter in weight and less expensive than solid steel pressure rolls or coated solid steel pressure rolls. Because composite materials have strength and fatigue resistance comparable to that of steel, the pressure rolls of the present invention perform as well as steel pressure rolls or coated steel pressure rolls. The present invention is also advantageous because a low scrap rate at production occurs because the surface of the tubular member can be finished to the desired smoothness prior to the completion of the pressure roll.

In another embodiment, a press has a pressure roll comprising a tubular member and support means extending generally axially through the tubular member and contacting the inner surfae of the tubular member wherein the support means is formed from a composite material. This embodiment results in an even lighter weight and less expensive pressure roll than solid steel pressure rolls or coated solid steel pressure rolls because the support means is formed substantially from a composite material.

An important object of this invention is to provide a multiple roll press or developer on which one of the load-bearing and nip-forming rolls contain a fiber composite material supporting an outer nip-forming metal shell.

A further object is to provide a lightweight and low cost construction for a press roll in a roll-type developer.

Another object of the invention is the provision of a method of making press rolls for roll-type presses or roll-type developers.

Other objects and advantages of the present invention will become apparent from the following description, attached drawings, and appended claims.

BRIEF DESCRIPTION OF THE DRAWINGS

FIG. 1 is a longitudinal cross-sectional view of a pressure roll made in accordance with one embodiment of this invention for use as one of the load-bearing press rolls in a multiple roll press or developer;

FIG. 2 is a diagrammatic view of a two-roll developer employing a modified form of the pressure roll, and in which the modified pressure roll is shown in longitudinal cross-section; and FIG. 3 is a longitudinal cross-sectional view of a pressure roll made in accordance with another embodiment of this invention.

DETAILED DESCRIPTION OF THE INVENTION

To form the pressure rolls 10 of the present invention as shown in FIG. 1-4, a tubular shell member 12 is used. A metallic material is used for the tubular member 12. Useful metallic materials for tubular member 12 include plain carbon steel and SAE-AISI steel C8620, with the latter material preferred.

The dimensions of the tubular member 12 can be varied as necessary for the particular application. As an example of the dimensions of a useful tubular member 12, the tubular member 12 can have a nominal length of about 9 inches (22.9 cm), a working zone length of about 8.5 inches (21.6 cm), a nominal diameter of about 1.98 inches (5.1 cm), and a thickness of about 0.062 inches (0.16 cm). Metallic tubular members 12 are commercially available.

The tubular member 12 can be heat treated as desired in order to improve the performance of the pressure rolls 10. The as-formed or as-purchased tubular member 12 is heat treated prior to taking any other production steps. Preferably, the tubular member 12 is a case-hardened steel. More preferably, the tubular member 12 is surface hardened to about 60 Rockwell C to a depth of at least 0.049 inches (0.125 cm). Hard chromium plating can be applied to the exposed outer surface of the tubular member 12 to a thickness of at least 0.002 inches (0.005 cm) for protection against rust.

The outer surface of the tubular member 12 can be machined to provide the desired finish. A low scrap rate is achieved because the outer surface of the tubular member 12 can be finished to the desired smoothness prior to the completion of the pressure roll 10.

While forming the pressure roll, the tubular member 12 is supported by conventional means. As shown in FIGS. 1, 2, and 4, a support shaft 14 is placed in the cylindrical space of the tubular member 12 such that the tubular member 12 and support shaft 14 are substantially longitudinally coaxial, i.e., the lengths of the tubular member 12 and the support shaft 14 are substantially parallel. A fiber reinforced or metallic material is used for the support shaft 14. Useful materials for support shaft 14 include steel and pultruded carbon fiber composite. Preferably, the material of support shaft 14 is pultruded carbon fiber composite.

Depending upon the particular application and the tubular member 12, the dimensions of the support shaft 14 can be varied as necessary. The length of support shaft 14 usually exceeds the length of the tubular member 12 so that the ends of the support shaft 14 can serve as journals in a pressure application apparatus. As an example of the dimensions of a useful support shaft 14, the support shaft 14 can have a nominal length of about 9.0 inches (22.9 cm), and a substantially uniform diameter of about 1.3 inches (3.3 cm) throughout its length. Metallic support shafts 14 are commercially available.

The support shaft 14 can be heat treated as desired. The ends of the support shaft 14 can be machined as necessary for use in conventional pressure application apparatus.

The support shaft 14 is temporarily supported by conventional means in the tubular member 12 while a composite fiber load-supporting material 16 is received in the annular space between the tubular member 12 and the support shaft 14. Useful composite materials 16 may include a composite material fabricated from carbon fiber based COFAB and epoxy resin. Preferably, the composite material 16 is COFAB/epoxy composite. COFAB is a carbon fiber reinforcement which is commercially available from Gulf States Paper Corporation. The carbon fiber fabric is layed up into the desired shape or form by winding on the shaft 14 as a mandrel. The wound fabric may then be inserted into the member 12 and the epoxy resin injected into the fabric or fiber form.

It is believed that a pressure roll consisting entirely of composite material will not have a surface hardness which can withstand the pressures required. Thus, the tubular member 12 is used to provide the necessary surface hardness. Such an approach is acceptable since the composite body, apart from its surface, does possess sufficient strength to withstand required pressures.

Conventional means for laying up the fiber fabric and injecting the epoxy resin material can be used. As shown in FIG. 1, the composite material 16 can be received in the tubular member 12 so as to substantially fill the annular space and the resin form bonds with the shell 12 and the shaft 14. The epoxy resin in the composite material 16 sets which holds the support shaft 14 in place. The pressure roll 10 can then be used in conventional pressure application apparatus. Because composite material has strength and fatigue resistance comparable to that of steel, the pressure rolls 10 of the present invention, in addition to being lighter in weight and less expensive, perform as well as solid steel pressure rolls or coated solid steel pressure rolls.

Another preferred embodiment of the roll 10 is shown at 10a in FIG. 2. The composite material 16 is formed in the annular space between the tubular member 12 and the support shaft 14 so that the composite material 16 interconnects support shaft 14 with the tubular member 12 by contacting at least a portion of the inner surface of the tubular member 12 and at least a portion of the outer surface of the support shaft 14.

In the embodiment of FIG. 2, the shaft 14 is joined to the shell member 12 at an axially central loading region 17. This region forms the exclusive load-bearing connection between the shell and the shaft. The material 16 is tapered at 18 so that it slopes away from the shaft 14 from the loading region 17 to the ends of the shell member 12. Such a taper provides for the controlled deflection of the shell portion of the roll 10a when the pressure roll is loaded by the application of a downward force at the ends of the shaft. Such a taper or contour of the internal surface of the material 16 on either side of the central loading region 17 provides for control of the moment of inertia, so that an approximately uniform pressure distribution may be defined along a nip between the roll 10 and a second roll.

It should be understood that the roll 10a of FIG. 2 is merely illustrative of one composite material configuration. Composite material 16 can be formed into numerous configurations as desired as long as the composite material interconnects the support shaft 14 with the tubular member 12. This feature of the present invention makes it particularly advantageous. Typically, to form such a pressure roll, a solid steel rod or a steel tube having a substantial thickness is machined down to the desired configuration. Such extensive machining is time consuming and expensive. Additionally, steel grip accumulates during the machining process. The present invention eliminates such unnecessary expense and waste because the composite material 16 can be easily formed into the desired configuration.

In another embodiment, a pressure roll 10b of FIG. 3 does not have a support shaft 14. Instead, the pressure roll 10b has support means extending generally axially through the tubular member 12 and contacting the inner surface of the tubular member 12 wherein the support means is formed as a composite material 16. This embodiment results in an even lighter weight and less expensive pressure roll 10 compared to solid steel pressure rolls or coated solid steel pressure rolls.

Preferably, the composite material 16 substantially fills the cylindrical space within the tubular member 12 and protrudes beyond the ends of the tubular member so as to form journals. The journals can be formed as desired in order to be useful in conventional pressure application apparatus. Because journals formed of composite material do not have sufficient surface hardness, steel sleeves 18 can be used on the journals so that the hardness of the sleeves 18 meets the surface hardness of the bearings supporting the journals. In the making of the embodiment of FIG. 3, the fiber is wound on a temporary axial steel mandrel, not shown, which is pressed out of the fabric form before the resin is injected into the fibers.

The operation of the invention is believed to be largely self-explanatory from the foregoing description.

FIG. 2 illustrates a two-roll press as described in the above-identified U.S. application Ser. No. 039,939 in which the roll 10a of FIG. 2 is used as the pressure developer roll 10a or 30 of that application. The composite roll 10 of FIG. 1 or 10b of FIG. 3 may be used in lieu of the roll 10a of FIG. 2 in appropriate cases.

The shaft 14 is loaded as shown by the arrows 24, and may be driven by a motor 23. The nip-forming pressure roll 20 may be of conventional construction. The matching of the press rolls is effected by considering the basic theory of beam bending, the deflections caused by shear stresses, the changes in cross-section at axial nodal positions, and the local effects in the deflection of the thin-walled shell.

The pressure rolls 10 of the present invention are useful in the application of a uniform pressure to any paper stock. Although not meant to limit the application of the pressure rolls of the present invention, they are particularly useful in fixing fusible toner images and in rupturing the microencapsulated imaging material of commonly assigned U.S. Pat. Nos. 4,399,209 and 4,440,846.

While the form of apparatus herein described constitutes a preferred embodiment of this invention, it is to be understood that the invention is not limited to this precise form of apparatus, and that changes may be made therein without departing from the scope of the invention which is defined in the appended claims.

What is claimed is:

1. A multiple roll press useful for the development of latent images by the rupture of microcapsules on a web or sheet, in which one of the nip-forming pressure rolls comprises:
   a tubular outer shell member formed of metal and having an outer cylindrical nip-forming surface and defining a cylindrical space therein,
   a support shaft disposed in said cylindrical space in generally coaxial relation to said shell member and defining with said member an annular space, and
   a composite fiber load-support material disposed in said annular space forming a bond with said shell member and said shaft, said composite fiber load-support material being formed of a wound carbon filament fabric impregnated with an epoxy resin.

2. The press of claim 1 in which said composite material substantially fills said annular space.

3. The press of claim 1 in which said composite material joins said shaft exclusively at an axial center loading region of said shaft and tapers away from said shaft as said material approaches the ends of said shell member.

4. A multiple roll press useful for the development of latent images by the rupture of microcapsules on a web or sheet, in which one of the nip-forming pressure rolls comprises:
   a tubular outer shell member formed of metal and having an outer cylindrical nip-forming surface, said member defining a cylndrical space therein and having open ends,
   a composite fiber load-support material disposed in said annular space forming a bond with said shell member;
   said composite fiber load-support material being formed of a wound carbon filament fabric impregnated with an epoxy resin; and
   means for supporting said one roll for rotation.

5. The press of claim 4 in which said supporting means comprises composite material extending through said open ends and forming journals.

6. The press of claim 5 in which said supporting means comprises a support shaft disposed in said cylindrical space through said composite material.

* * * * *